(12) United States Patent
Oi

(10) Patent No.: US 6,194,320 B1
(45) Date of Patent: Feb. 27, 2001

(54) METHOD FOR PREPARING A SEMICONDUCTOR DEVICE

(75) Inventor: Makoto Oi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/908,636

(22) Filed: Aug. 7, 1997

(30) Foreign Application Priority Data

Feb. 20, 1997 (JP) .................................................... 9-036346

(51) Int. Cl.$^7$ .................................................. H01L 21/311
(52) U.S. Cl. .......................... 438/703; 438/704; 438/724; 438/744; 438/756; 438/757; 438/763; 216/47; 216/57; 216/79; 216/99
(58) Field of Search .................................... 438/694, 703, 438/704, 724, 744, 756, 757, 763, 778; 216/47, 49, 51, 57, 79, 99

(56) References Cited

U.S. PATENT DOCUMENTS

| | | | |
|---|---|---|---|
| 3,940,288 | * 2/1976 | Takagi et al. | 438/365 |
| 5,327,378 | * 7/1994 | Kazerounian | 365/185.16 |
| 5,455,438 | * 10/1995 | Hashimoto et al. | 257/391 |
| 5,776,807 | * 7/1998 | Ronkainen et al. | 438/202 |
| 5,834,349 | * 11/1998 | Tseng | 438/253 |

FOREIGN PATENT DOCUMENTS

| | | |
|---|---|---|
| 6-13625 | 1/1994 | (JP) . |
| 7-193145 | 7/1995 | (JP) . |
| 8-204031 | 8/1996 | (JP) . |

* cited by examiner

Primary Examiner—Randy Gulakowski
Assistant Examiner—Allan Olsen
(74) Attorney, Agent, or Firm—Oblon, Spivak, McClelland, Maier & Neustadt, P.C.

(57) ABSTRACT

In a method for preparing a semiconductor device wherein a first silicon oxide film, a second silicon oxide film and a silicon nitride film are sequentially deposited on a silicon substrate, and both silicon oxide films and the silicon nitride film are patterned, a patterned resist 45 is formed on the silicon nitride film, the silicon nitride film is etched with phosphoric acid the resist serving as a mask, and both silicon oxide films are etched with hydrofluoric acid the resist serving as a mask.

6 Claims, 11 Drawing Sheets

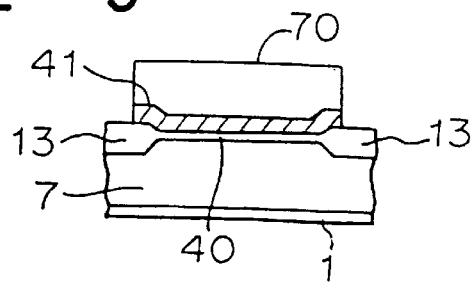
FIGURE 5
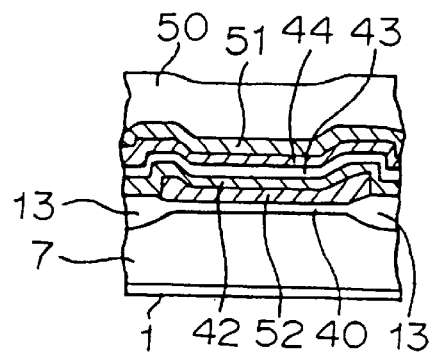
FIGURE 6
FIGURE 7
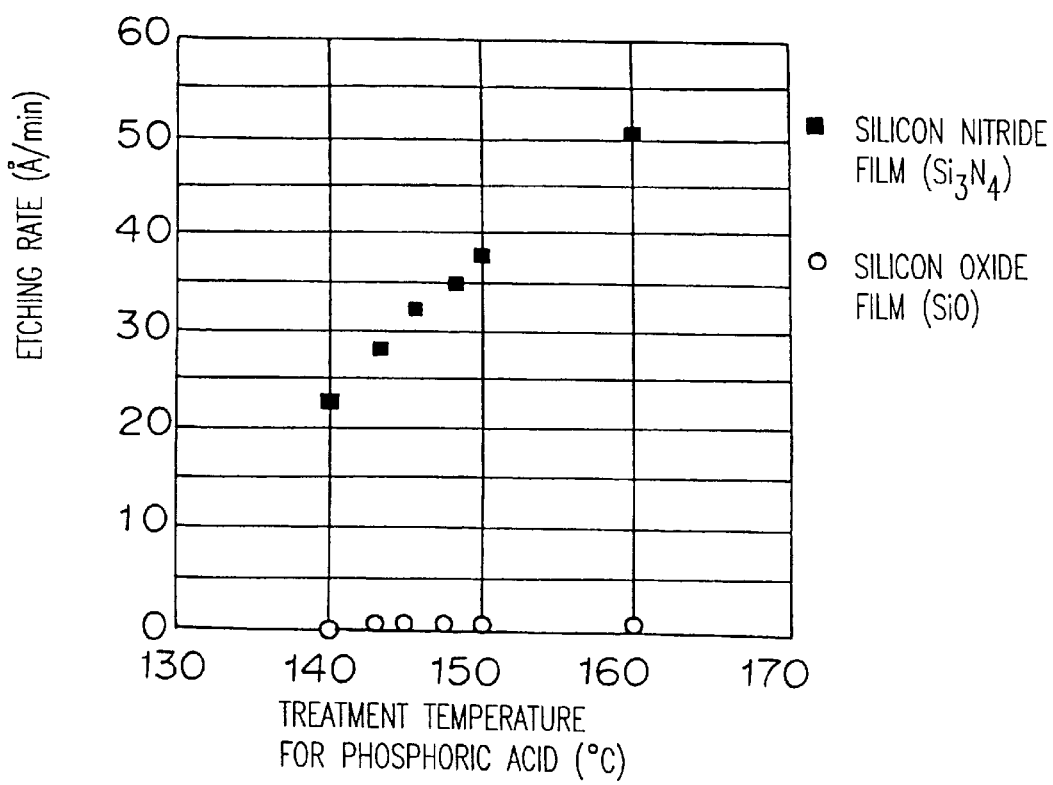

METHOD FOR PREPARING A SEMICONDUCTOR DEVICE

The present invention relates to a method for preparing a semiconductor device, comprising sequentially depositing a silicon oxide film and a silicon nitride film on a semiconductor substrate and patterning the films.

In FIGS. 9–14, there is shown a cross-sectional view of a conventional method for preparing a semiconductor device, which has been disclosed in e.g. JP-A-7-193145. A semiconductor device is generally constituted by a memory cell region for forming memory cells and a peripheral region for forming peripheral circuits. The peripheral region is shown on the left side in the respective figures, and the memory cell region is shown on the right side in the respective figures. Now, the conventional method for preparing a semiconductor device will be described in reference to the respective figures.

First, a silicon oxide film 2 having a thickness of 300 angstrom is deposited on a silicon substrate. A silicon nitride film 3 having a thickness of 500 angstrom is deposited on the silicon oxide film 2 by a low pressure CVD (Chemical Vapor Deposition) method. A resist 4 which is patterned so as to expose only an n-type well forming region is formed on the silicon nitride film 3. The silicon nitride film 3 is etched by dry-etching with a gas of $CHF_3/CF_4/Ar=10/70/800$, a pressure of 500 mTorr, an output of 500 W and a time period of 20 sec, the resist 4 serving as a mask. The silicon substrate 1 has phosphorus (P) put thereinto by ion implantation, the resist 4 serving as a mask (FIG. 9(a)).

Next, the resist 4 is removed, and an oxide film 5 having a thickness of 5000 angstrom is formed, the silicon nitride film 3 serving as a mask. The silicon nitride film 3 is removed by hot phosphoric acid. A p-type well forming region has boron (B) put thereinto by ion implantation, the oxide film 5 serving as a mask (FIG. 9(b)). The impurity which is doped in the silicon substrate 1 is thermally diffused to form n-type wells 6 and p-type wells 7 (FIG. 9(c)).

Next, the oxide film 5 and the oxide film 2 are removed with hydrofluoric acid. A silicon oxide film 8 having a thickness of 300 angstrom, a polysilicon film 9 having a thickness of 1000 angstrom and a silicon nitride film 10 having a thickness of 2000 angstrom are sequentially deposited on the silicon substrate 1. A resist 11 which is patterned so as to expose only field oxide forming regions as a separation insulating film is formed on the silicon nitride film 10. Dry-etching with a gas of $CHF_3/CF_4/Ar=10/70/800$, a pressure of 500 mTorr, an output of 500 W and a time period of 30 sec is carried out, the oxide film 5 serving as a mask, to etch the silicon nitride film 10 (FIG. 9(d)).

Next, a resist 12 which is patterned so as to expose only the p-type wells 7 in the field oxide forming regions is formed to cover the resist 11. Ion implantation with boron (B) is carried out, the resist 12 and the resist 11 serving as a mask (FIG. 10(a)). The resist 11 and the resist 12 are removed. Heat annealing is carried out, the silicon nitride film 10 serving as a mask, to form field oxides 13 having a thickness of 7000 angstrom. At that time, p⁺-channel stopper regions 14 are simultaneously formed (FIG. 10(b)). (The p⁺-channel stopper regions 14 are omitted in the subsequent figures.)

Next, the silicon nitride film 10 is removed with hot phosphoric acid. Dry-etching with a gas of $SF_6=100$ cc/min, a pressure of 600 mTorr, an output of 100 W and a time period of 35 sec is carried out to remove the polysilicon film 9. Ion implantation with boron is carried out only in the memory cell region, a resist (not shown) serving as a mask, to control a threshold voltage of a memory transistor.

Next, the silicon oxide film 8 is removed with hydrofluoric acid. A silicon oxide film 15 having a thickness of 100 angstrom is formed on the silicon substrate 1 by a thermal oxidation method (FIG. 10(c)). A polysilicon film 16 having a thickness of 1000 angstrom is deposited on the silicon oxide film 15 by a CVD method. A resist 17 which is patterned so as to cover the memory cell region is formed on the polysilicon film 16. Dry-etching with a gas of $Cl_2/O_2=36/4$, a pressure of 5 mTorr, an output of 20 W and a time period of 41 sec is carried out to etch the polysilicon film 16 (FIG. 10(d)). During this etching, the polysilicon film 16 is patterned in a cross-section different from the figure, i.e. in a cross-section taken along the line XIII—XIII of FIG. 10(d). In FIG. 13, there is shown a cross-sectional view taken along the line XIII—XIII of FIG. 10(d). The resist 17 is removed.

Next, a silicon oxide film 18 having a thickness of 60 angstrom is layered on the silicon substrate 1 by a CVD method. A silicon nitride film 19 having a thickness of 100 angstrom is layered on the silicon substrate 1 by a CVD method. A silicon oxide film 20 having a thickness of 60 angstrom is further layered on the silicon substrate 1 by a CVD method FIG. 11. A resist which is patterned so as to cover the memory cell region is formed on the silicon oxide film 20.

Next, the substrate is immersed in a solution of HF (hydrofluoric acid) at 25° C. to carry out wet etching, the resist 21 serving as a mask, to etch the silicon oxide film 20. A parallel plate etching system is used to carry out dry-etching with a gas of $SF_6/F_{22}=48/12$, a pressure of 275 mTorr, an output of 100 W, a time period of 18 sec, the resist 21 serving as a mask, to etch the silicon nitride film 19. The substrate is immersed in a solution of HF (hydrofluoric acid) at 25° C., the resist serving as a mask, to carry out wet etching so as to etch the silicon oxide film 18 and the silicon oxide film 15 (FIG. 11).

Next, the resist is removed, and an upper surface of the silicon substrate 1 is treated with hydrofluoric acid to remove a natural oxide film. A thermal oxidation film as a gate oxide is formed on the silicon substrate 1 by a thermal oxidation method (FIG. 11). A polysilicon film having a thickness of 2000 angstrom is deposited on the thermal oxide film and the silicon oxide film 24 by a CVD method. A patterned resist 24 is formed on the polysilicon film. Dry-etching with a gas of $Cl_2/O_2=36/4$, a pressure of 5 mTorr, an output of 30 W and a time period of 60 sec is carried out, the resist serving as a mask, to etch the polysilicon film so as to form gate electrodes in the peripheral region.

Next, the resist is removed. A patterned resist is formed on the gate electrodes and the polysilicon film. Dry-etching with a gas of $Cl_2/O_2=36/4$, a pressure of 5 mTorr, an output of 30 W and a time period of 60 sec is carried out, the resist 26 serving as a mask, to etch the polysilicon film 23. A dry-etching with a gas of $CF_4/Ar=70/800$, a pressure of 700 mTorr, an output of 200 W and a time period of 20 sec is carried out to etch the silicon oxide film 20, the silicon nitride film 19 and the silicon oxide film 18. Dry-etching with a gas of $Cl_2/O_2=36/4$, a pressure of 5 mTorr, an output of 30 W and a time period of 60 sec is carried out to etch the polysilicon film 16. As a result, control gates 27 and floating gates 28 are formed in the memory cell region to provide nonvolatile gate electrodes (FIG. 12(a)). Obviously from FIG. 14 showing a cross-sectional view taken along the line XVI—XVI of FIG. 12(a), the floating gates 28 have sidewalls provided with the silicon oxide film 20, the silicon nitride film 19 and the silicon oxide film 18 layered.

Next, the resist 26 is removed, and sidewall insulating films 29, source/drain regions 30 in the memory cell region, source/drain regions 31 in the peripheral region, a silicon oxide film 32, a silicon nitride film 33, and a smooth coating film 34 are sequentially formed. Contact holes 35 are formed so as to reach surfaces of the respective source/drain regions 30 and 31. An aluminum wiring film 36 is formed on the smooth coating film 34 by sputtering so as to make connection with the respective source/drain regions 30 and 31 through the contact holes 35 (FIG. 12(b)).

Next, a smooth coating film 37 is formed on the silicon substrate 1. The smooth coating film 37 has through holes 38 formed therein to expose a surface of the aluminum wiring film 36. A patterned aluminum wiring film 39 is formed to pass through the through holes 38, providing a flash memory (FIG. 12(c)).

In the conventional method for preparing a semiconductor device, etching the silicon nitride film 19 has been carried out by dry-etching, and etching the silicon oxide film 18 has been carried out with hydrofluoric acid as shown in FIG. 11. There has been created a problem in that unless the silicon nitride film 19 on the silicon oxide film 18 is completely removed, unremoved portions of the silicon nitride film 19 serve as a mask when removing the silicon oxide film 18 to leave some portions of the silicon oxide film 18 so as to make difficult stable formation of the thermal oxide film 22 as the gate oxide in the peripheral region since the etching rate of the silicon nitride film 19 with hydrofluoric acid is approximately to 0.

In order to completely remove the silicon nitride film 19, it is necessary to subject the silicon nitride film 19 to over-etching. However, the etching rate of the silicon oxide film 18 and that of the silicon nitride film 19 are almost the same in dry-etching of the silicon nitride film 19. It is extremely difficult to selectively etch only the silicon nitride film 19 in a stable manner under such an etching condition, and under conditions wherein the film thickness of the silicon nitride film 19 is as small as 100 angstrom, and the film thickness of the silicon oxide film 18 is as small as 60 angstrom. For example, it is assumed that etching develops through the silicon oxide film 18 to reach the silicon substrate 1 in the over-etching.

If the etching reaches the silicon substrate 1, there is created a problem in that the silicon substrate is greatly damaged to contribute to unstable operation of the semiconductor device with the silicon substrate incorporated thereinto because the etching rate of the silicon substrate is about twice that of the silicon nitride film 19 in dry-etching of the silicon nitride film 19.

It is an object of the present invention to solve these problems, and to provide a method for preparing a semiconductor device of having a silicon nitride film without having any influence on a silicon oxide film underlying the silicon nitride film.

According to a first aspect of the present invention, there is provided a method for preparing a semiconductor device comprising sequentially depositing a silicon oxide film and a silicon nitride film on a semiconductor substrate; forming a patterned resist on the silicon nitride film; etching the silicon nitride film with phosphoric acid, the resist serving as a mask; and etching the silicon oxide film with hydrofluoric acid, the resist serving as a mask; thereby to pattern the silicon oxide film and the silicon nitride film.

According to a second aspect of the present invention, there is provided a method for preparing a semiconductor device comprising sequentially depositing a first silicon oxide film, a first silicon nitride film, a second silicon oxide film and a second silicon nitride film on a semiconductor substrate; forming a first patterned resist on the second silicon nitride film; dry-etching the second silicon nitride film, the first resist serving as a mask; etching the second silicon oxide film with hydrofluoric acid, the first resist serving as a mask; removing the first resist to expose the first silicon nitride film and the second silicon nitride film; etching the first silicon nitride film and the second silicon nitride film exposed on an upper surface of the semiconductor substrate with phosphoric acid; forming a second resist patterned in the same shape as the first resist on the semiconductor substrate; and etching the first silicon oxide film with hydrofluoric acid, the second resist serving as a mask; thereby to pattern the first silicon oxide film, the first silicon nitride film, and the second silicon oxide film.

According to a third aspect of the present invention, there is provided a method for preparing a semiconductor device comprising depositing a first silicon oxide film on a semiconductor substrate with a memory cell region and a peripheral region; depositing a first conductive film in the memory cell region; sequentially depositing a second silicon oxide film, a silicon nitride film and a third silicon oxide film so as to cover the semiconductor substrate and the first conductive film; forming a resist so as to be patterned to cover the memory cell region; etching the third silicon oxide film with hydrofluoric acid, the resist serving as a mask; etching the silicon nitride film with phosphoric acid, the resist serving as a mask; etching the second silicon oxide film and the first silicon oxide film with hydrofluoric acid, the resist serving as a mask; removing the resist; depositing a gate oxide in the peripheral region on the semiconductor substrate; depositing a second conductive film so as to cover the semiconductor substrate and the third silicon oxide film; patterning the second conductive film to form gate electrodes in the peripheral region; and patterning the second conductive film, the second silicon oxide film, the silicon nitride film and the third silicon oxide film to form nonvolatile gate electrodes in the memory cell region.

According to a fourth aspect of the present invention, there is provided a method for preparing a semiconductor device comprising depositing a first silicon oxide film on a semiconductor substrate with a memory cell region and a peripheral region; depositing a first conductive film in the memory cell region; sequentially depositing a second silicon oxide film, a first silicon nitride film, a third silicon oxide film and a second silicon nitride film so as to cover the semiconductor substrate and the first conductive film; forming a first resist so as to be patterned to cover the memory cell region; dry-etching the second silicon nitride film, the resist serving first as a mask; etching the third silicon oxide film with hydrofluoric acid, the resist serving first as a mask; removing the first resist to expose the first silicon nitride film and the second silicon nitride film; etching the first silicon nitride film and the second silicon nitride film exposed on an upper surface of the semiconductor substrate with phosphoric acid; forming a second resist patterned in the same shape as the first resist on the semiconductor substrate; etching the second silicon oxide film and the first silicon oxide film with hydrofluoric acid, the second resist serving as a mask; removing the second resist; depositing a gate oxide in the peripheral region on the semiconductor substrate; depositing a second conductive film so as to cover the semiconductor substrate and the third silicon oxide film; patterning the second conductive film to form gate electrodes in the peripheral region; and patterning the second conductive film, the second silicon oxide film, the first silicon nitride film and the third silicon oxide film to form nonvolatile gate electrodes in the memory cell region.

According to a fifth aspect of the present invention, a treatment temperature for the phosphoric acid is set in a range of 100° C.—a boiling point of the phosphoric acid in the method of either one of the first to fourth aspects.

In accordance with the first aspect of the present invention, it is possible to provide a method for preparing a semiconductor device wherein removal of only the silicon nitride film is ensured without etching the silicon oxide film in etching the silicon nitride film because the silicon oxide film is etched with hydrofluoric acid, the resist serving as a mask.

In accordance with the second aspect of the present invention, it is possible to provide a method for preparing a semiconductor device wherein removal of only the first silicon nitride film is ensured without using a resist in etching of the first silicon nitride film, and without etching the first silicon oxide film.

In accordance with the third aspect of the present invention, it is possible to provide a method for preparing a semiconductor device wherein a circuit in the peripheral region can stably operate because removal of only the silicon nitride film is ensured without etching the silicon oxide film in etching the silicon nitride film.

In accordance with the fourth aspect of the present invention, it is possible to provide a method for preparing a semiconductor device wherein a circuit in the peripheral region can stably operate because removal of only the first silicon nitride film is ensured without need for a resist in etching of the first silicon nitride film, and without etching the second silicon oxide film.

In accordance with the fifth aspect of the present invention, it is possible to provide a method for preparing a semiconductor device wherein removal of only the respective silicon nitride films is ensured.

In the drawings:

FIGS. 1(a)–(d) are cross-sectional views of the method for preparing a semiconductor device according to a first embodiment of the present invention;

FIGS. 2(a)–(d) are cross-sectional views of the method according to the first embodiment;

FIGS. 3(a)–(d) are cross-sectional views of the method according to the first embodiment;

FIGS. 4(a)–(c) are cross-sectional views of the method according to the first embodiment;

FIG. 5 is a cross-sectional view taken along the line V—V of FIG. 2(d);

FIG. 6 is a cross-sectional view taken along the line VI—VI of FIG. 4(a);

FIG. 7 is a graph showing the relationship between the etching rates of a silicon nitride film and a silicon oxide film with respect to the treatment temperature of phosphoric acid;

Figure 10:
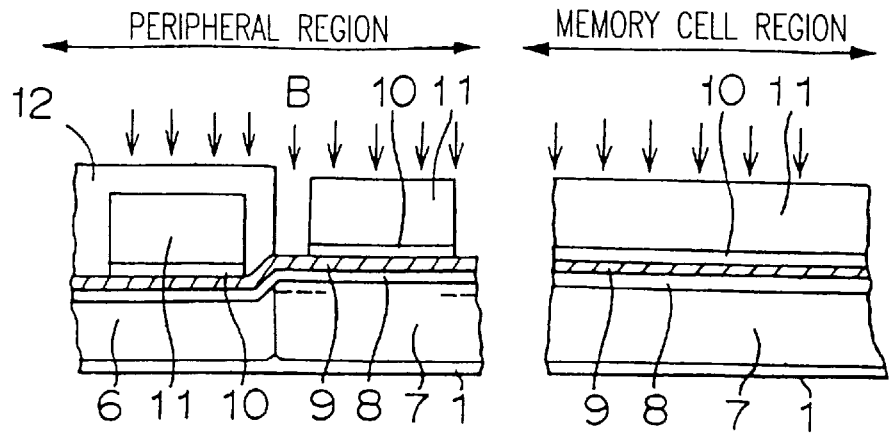
Figure 10:
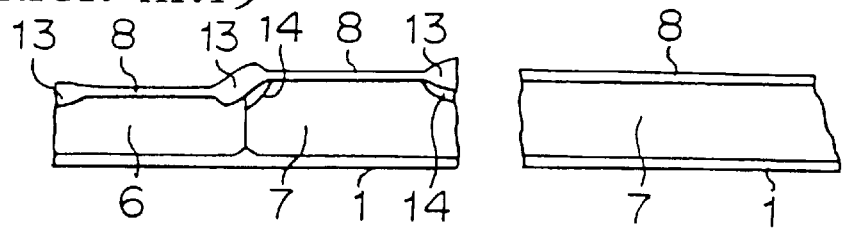
Figure 10:
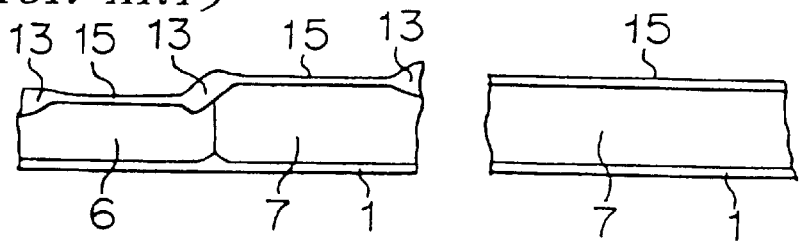
Figure 10:
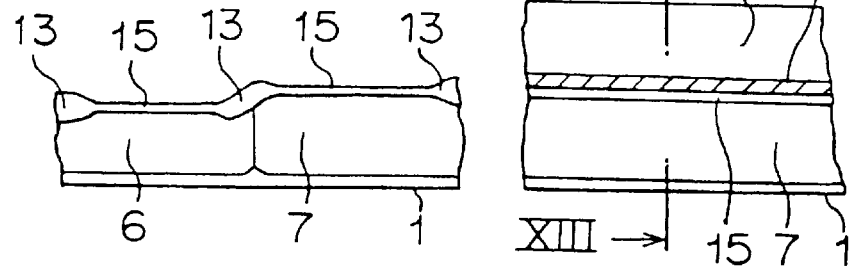
Figure 11:
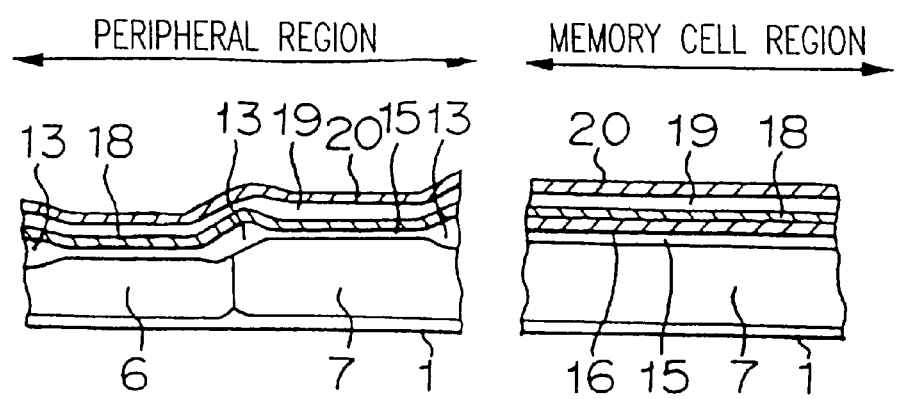
Figure 12A:
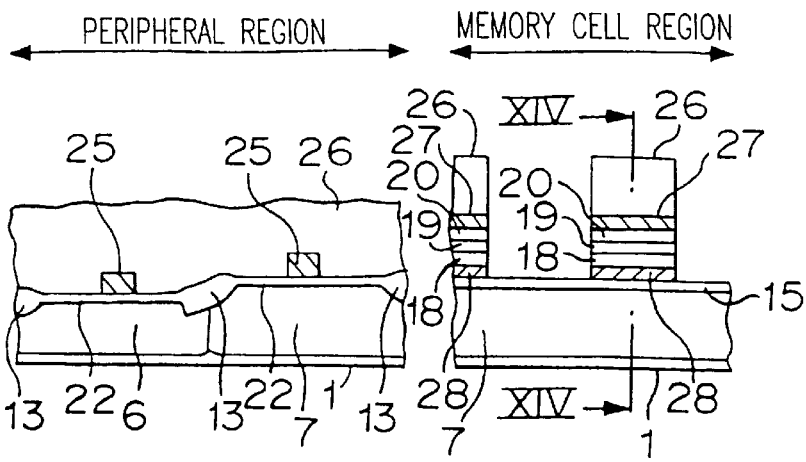
Figure 12B:
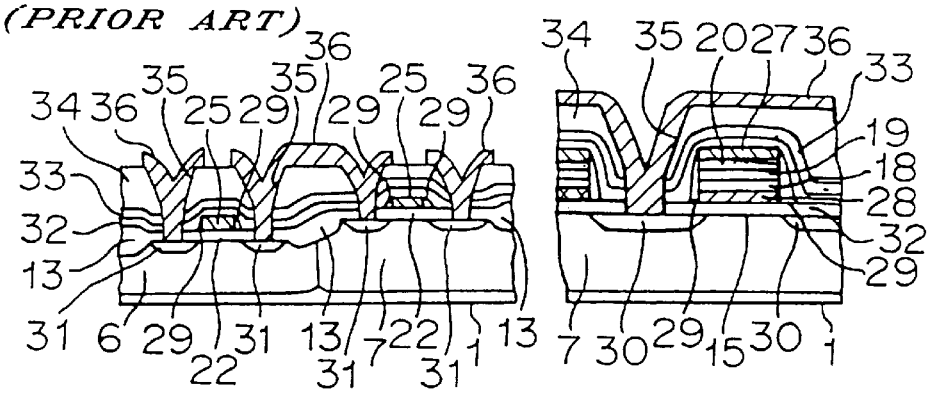
Figure 12C:
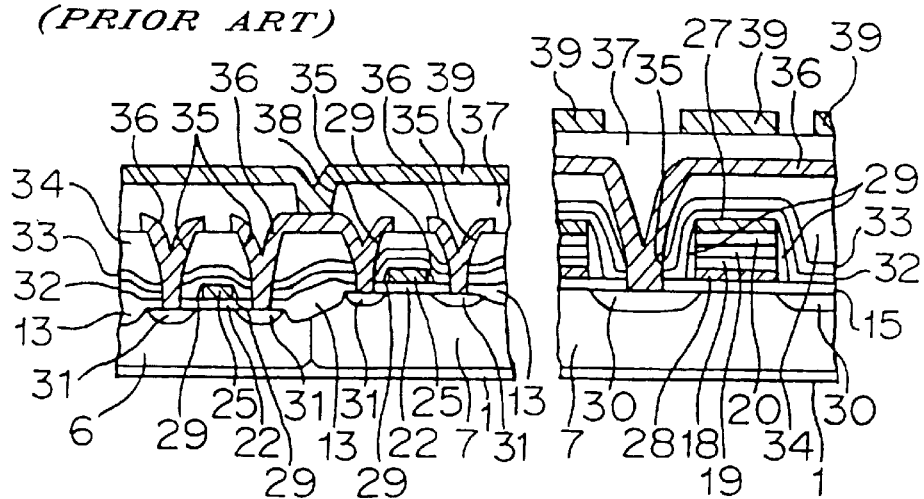
Figure 13:
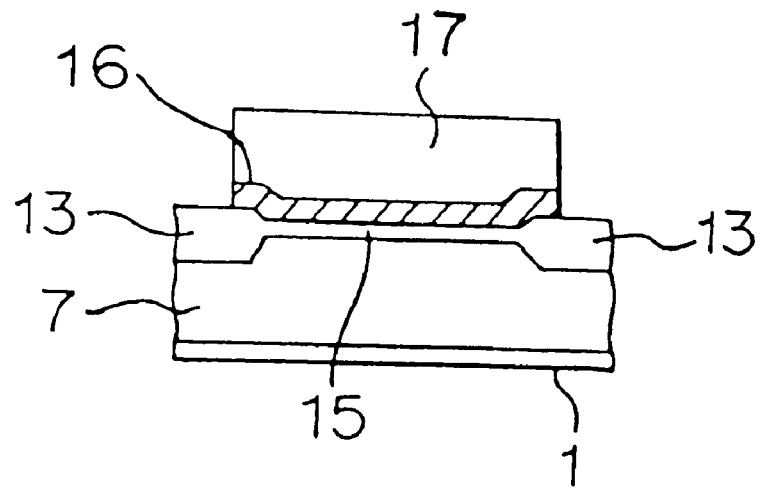
Figure 14:
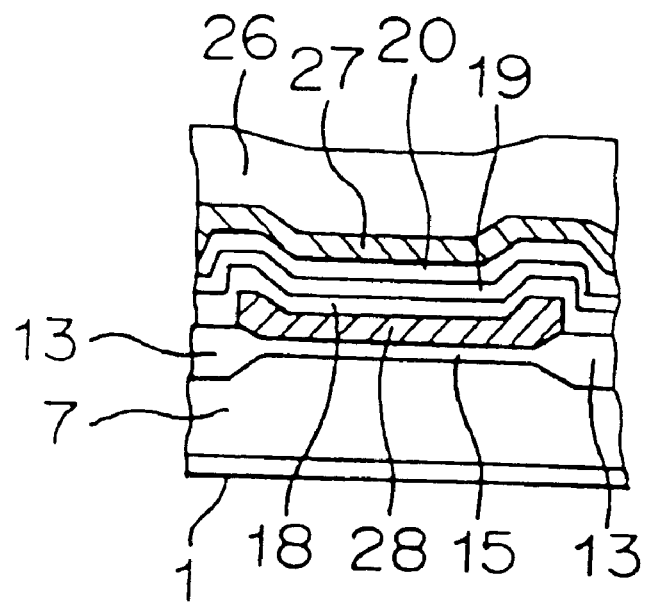

FIGS. 8(a)–(d) are cross-sectional views of the method for preparing a semiconductor device according to a second embodiment of the present invention;

FIGS. 9(a)–(d) are cross-sectional views of a conventional method for preparing a semiconductor device;

FIGS. 10(a)–(d) are cross-sectional views of the conventional method;

FIG. 11 is a cross-sectional view of the conventional method;

FIGS. 12(a)–(c) are cross-sectional views of the conventional method;

FIG. 13 is a cross-sectional view taken along the line XIII—XIII of FIG. 10(d); and FIG. 14 is a cross-sectional view taken along the line XIV—XIV of the FIG. 12(a).

Now, preferred embodiments according to the present invention will be described in detail in reference to the accompanying drawings.

EMBODIMENT 1

In FIGS. 1–6, there is shown a cross-sectional view of the method for preparing a semiconductor device according to a first embodiment of the present invention. The semiconductor device is constituted by a memory cell region for forming memory cells and a peripheral region for forming peripheral circuits like the conventional semiconductor device. The peripheral region is shown on the left side in the respective figures, and the memory cell region is shown on the right side in the respective figures. Now, the method according to the first embodiment will be described in reference to the respective figures.

First, a silicon oxide film 2 having a thickness of 300 angstrom is deposited on a silicon substrate 1 as in the conventional method. A silicon nitride film 3 having a thickness of 500 angstrom is deposited on the silicon oxide film 2 by a low pressure CVD (Chemical Vapor Deposition) method. A resist 4 which is patterned so as to expose only an n-type well forming region is formed on the silicon nitride film 3. The silicon nitride film 3 is etched by dry-etching with a gas of $CHF_3/CF_4/Ar=10/70/800$, a pressure of 500 mTorr, an output of 500 W and a time period of 20 sec, the resist serving 4 as a mask. The silicon substrate 1 has phosphorus (P) put thereinto by ion implantation, the resist 4 serving as a mask (FIG. 1(a)).

Next, the resist 4 is removed, and an oxide film 5 having a thickness of 5000 angstrom is formed, the silicon nitride film 3 serving as a mask. The silicon nitride film 3 is removed by hot phosphoric acid. A p-type well forming region has boron (B) put thereinto by ion implantation, the oxide film 5 serving as a mask (FIG. 1(b)). The impurity which is doped in the silicon substrate 1 is thermally diffused to form n-type wells 6 and p-type wells 7 (FIG. 1(c)).

Next, the oxide film 5 and the oxide film 2 are removed with hydrofluoric acid. A silicon oxide film 8 having a thickness of 300 angstrom, a polysilicon film 9 having a thickness of 1000 angstrom and a silicon nitride film 10 having a thickness of 2000 angstrom are sequentially deposited on the silicon substrate 1. A resist 11 which is patterned so as to expose only field oxide forming regions as a separation insulating film is formed on the silicon nitride film 10. Dry-etching with a gas of $CHF_3/CF_4/Ar=10/70/800$, a pressure of 500 mTorr, an output of 500 W and a time period of 30 sec is carried out, the resist 11 serving as a mask, to etch the silicon nitride film 10 (FIG. 1(d)).

Next, a resist 12 which is patterned so as to expose only the p-type wells 7 in the field oxide forming regions is formed to cover the resist 11. Ion implantation with boron (B) is carried out, the resist 12 and the resist 11 serving as a mask (FIG. 2(a)). The resist 11 and the resist 12 are removed. Heat annealing is carried out, the silicon nitride film 10 serving as a mask, to form field oxides 13 having a thickness of 7000 angstrom. At that time, $p^+$-channel stopper regions 14 are simultaneously formed (FIG. 2(b)). (The $p^+$-channel stopper regions 14 are omitted in the subsequent figures.)

Next, the silicon nitride film 10 is removed with hot phosphoric acid. Dry-etching with a gas of $SF_6=100$ cc/min, a pressure of 600 mTorr, an output of 100 W and a time period of 35 sec is carried out to remove the polysilicon oxide film 9. Ion implantation with boron is carried out only in the memory cell region, a resist (not shown) serving as a mask, to control a threshold voltage of a memory transistor.

Next, the silicon oxide film 8 is removed with hydrofluoric acid. A first silicon oxide film 40 having a thickness of 100 angstrom is formed on the silicon substrate 1 by a thermal oxidation method (FIG. 2(c)). A first polysilicon film 41 having a thickness of 1000 angstrom as a first conductive film is deposited on the first silicon oxide film 40 by a CVD method. A resist 70 which is patterned so as to cover the memory cell region is formed on the polysilicon film 41. Dry-etching with a gas of $Cl_2/O_2=36/4$, a pressure of 5 mTorr, an output of 20 W and a time period of 41 sec is carried out to etch the first polysilicon film 41 (FIG. 2(d)). During this etching, the first polysilicon film 41 is patterned in a cross-section different from the figure, i.e. in a cross-section taken along the line V—V of FIG. 2(d). In FIG. 5, there is shown a cross-sectional view taken along the line V—V of FIG. 2(d). The resist 70 is removed.

Next, a second silicon oxide film 42 having a thickness of 60 angstrom is layered on the silicon substrate 1 by a CVD method. A silicon nitride film 43 having a thickness of 100 angstrom is layered on the silicon substrate 1 by a CVD method. A third silicon oxide film 44 having a thickness of 60 angstrom is further layered on the silicon substrate 1 by a CVD method (FIG. 3(a)). A resist 45 which is patterned so as to cover the memory cell region is formed on the third silicon oxide film 44.

Next, the substrate is immersed in a solution of HF (hydrofluoric acid) at 25° C. to carry out wet etching, the resist 45 serving as a mask, to etch the third silicon oxide film 44. Phosphoric acid is used, the resist 45 as a mask, to etch the silicon nitride film 43. The substrate is immersed in a solution of HF (hydrofluoric acid) at 25° C., the resist serving 45 as a mask, to carry out wet etching so as to etch the second silicon oxide film 42 and the first silicon oxide film 40 (FIG. 3(b)).

As explained, the second silicon oxide film 42 underlying the silicon nitride film 43 is prevented from being etched during etching of the silicon nitride film 43 because etching of the silicon nitride film is carried out with phosphoric acid. This is because silicon oxide films have property to be hardly etched with phosphoric acid as clearly shown in FIG. 7. As a result, the etching margin of the silicon nitride film 43 can be extremely expanded in comparison with the conventional way with dry-etching. Removal of the silicon nitride film 43 is ensured.

With regard to the treatment temperature for phosphoric acid during this etching, the time required for the treatment can be shortened because the higher the treatment temperature, the larger the etching rate of the silicon nitride film 43 gets. The treatment temperature for phosphoric acid is required to be set considering the heat-resistant temperature of the resist 45 because the resist 45 is served as a mask. If the treatment temperature for phosphoric acid during etching of the silicon nitride film is set at a temperature of 100° C. to at the boiling temperature of phosphoric acid at which the etching rate of the silicon nitride film is over 0, removal of the silicon nitride film 43 is further ensured as estimated from FIG. 7.

Next, the resist 45 is removed, and an upper surface of the silicon substrate 1 is treated with hydrofluoric acid to remove a natural oxide film. A thermal oxidation film 46 as a gate oxide is formed on the silicon substrate 1 by a thermal oxidation method (FIG. 3(c)). A polysilicon film 47 having a thickness of 2000 angstrom as a second conductive film is deposited on the thermal oxide film 46 and the third silicon oxide film 44 by a CVD method (the second conductive film may be constituted in a structure with e.g. a refractory metal film and a polysilicon film layered). A patterned resist 48 is formed on the second polysilicon film 47 (FIG. 3(d)). Dry-etching with a gas of $Cl_2/O_2=36/4$, a pressure of 5 mTorr, an output of 30 W and a time period of 60 sec is carried out, the resist 48 serving as a mask, to etch the second polysilicon film 47 so as to form gate electrodes 49 in the peripheral region.

Next, the resist 48 is removed. A patterned resist 50 is formed on the gate electrodes 49 and the second polysilicon film 47. Dry-etching with a gas of $Cl_2/O_236/4$, a pressure of 5 mTorr, an output of 30 W and a time period of 60 sec is carried out, the resist 50 serving as a mask, to etch the second polysilicon film 47. A dry-etching with a gas of $CF_4/Ar=70/800$, a pressure of 700 mTorr, an output of 200 W and a time period of 20 sec is carried out to etch the third silicon oxide film 44, the silicon nitride film 43 and the second silicon oxide film 42. Dry-etching with a gas of $Cl_2/O_2=36/4$, a pressure of 5 mTorr, an output of 30 W and a time period of 60 sec is carried out to etch the first polysilicon film 41. As a result, control gates 51 and floating gates 52 are formed in the memory cell region to provide nonvolatile gate electrodes (FIG. 4(a)). Obviously from FIG. 6 showing a cross-sectional view taken along the line VI—VI of FIG. 4(a), the floating gates 52 have sidewalls provided with the third silicon oxide film 44, the silicon nitride film 43 and the second silicon oxide film 42 layered.

Next, the resist 50 is removed, and sidewall insulating films 53, source/drain regions 54 in the memory cell region, source/drain regions 55 in the peripheral region, a silicon oxide film 56, a silicon nitride film 57, and a smooth coating film 58 are sequentially formed. Contact holes 59 are formed so as to reach surfaces of the respective source/drain regions 54 and 55. An aluminum wiring film 60 is formed on the smooth coating film 58 by sputtering so as to make connection with the respective source/drain regions 54 and 55 through the contact holes 59 (FIG. 4(b)).

Next, a smooth coating film 61 is formed on the silicon substrate 1. The smooth coating film 61 has through holes 62 formed therein to expose a surface of the aluminum wiring film 60. A patterned aluminum wiring film 63 is formed to pass through the through holes 62, providing a flash memory (FIG. 4(c)).

In accordance with the method according to the first embodiment as explained, the silicon nitride film 43 can be completely removed without etching the second silicon oxide film 42 since etching the silicon nitride film 43 is carried out with phosphoric acid. As a result, the silicon substrate 1 can be prevented from being damaged, and etching the second silicon oxide film 42 and the first silicon oxide film 40 is ensured in a subsequent process.

Although explanation on the first embodiment has been made for the case wherein the second silicon oxide film 42 is deposited by a CVD method, the deposition of the second silicon oxide film is not limited to this method. Even if the second silicon oxide film is deposited by a thermal oxidation method, a similar advantage can be offered.

EMBODIMENT 2

In FIGS. 8(a)–(d), there is shown a cross-sectional view of the method for preparing a semiconductor device according to a second embodiment of the present invention. Now, the method according to the second embodiment will be described in reference to FIGS. 8(a)–(d).

After the first polysilicon film 41 is etched as shown in FIG. 2(d) following the same processes as those of the first embodiment, a second silicon oxide film 64 having a thickness of 60 angstrom is deposited on the silicon substrate 1 by a CVD method. A first silicon nitride film 65 having a thickness of 100 angstrom is layered on the silicon substrate 1 by a CVD method. A third silicon oxide film 66 having a thickness of 60 angstrom is layered on the silicon substrate 1 by a CVD method. A second silicon nitride film 67 having a thickness of 100 angstrom is layered on the silicon substrate 1 by a CVD method (FIG. 8(a)).

Next, a first resist 68 which is patterned so as to cover the memory cell region is formed on the second silicon nitride film 67. Dry-etching with a gas of $SF_6/F_{22}$=48/12, a pressure of 275 mTorr, an output of 100 W and a time period of 18 sec is carried out, the first resist 68 serving as a mask, to etch the second silicon nitride film 67.

The margin during this dry-etching corresponds to the total thickness of the first silicon oxide film 40, the second silicon oxide film 64, the first silicon nitride film 65 and the third silicon oxide film 66 underlying the second silicon nitride film 67. As a result, dry-etching the second silicon nitride film 67 can be stably carried out without having an influence on the silicon substrate 1 because the margin is increased by the total thickness of the first silicon nitride film 65 and the third silicon oxide film 66 in comparison with the total thickness of the first silicon oxide film 15 and the second silicon oxide film 18 as the margin in the conventional dry-etching of the silicon nitride film 19 shown in FIG. 11.

Figure 1A:
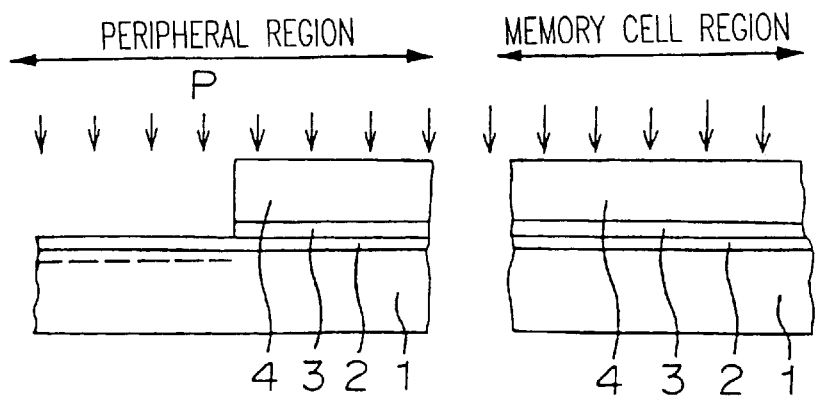
Figure 1B:
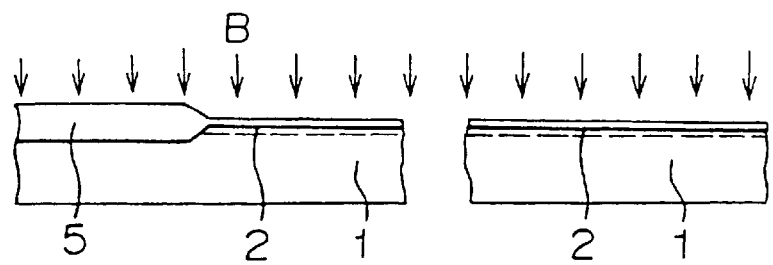
Figure 1C:
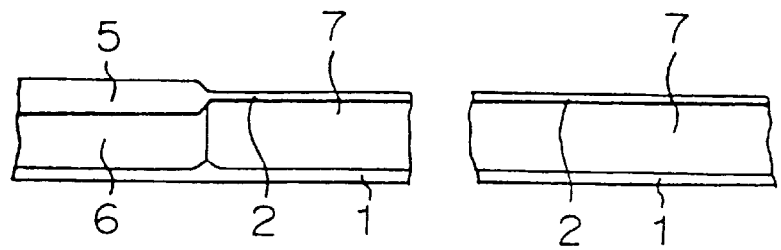
Figure 1D:
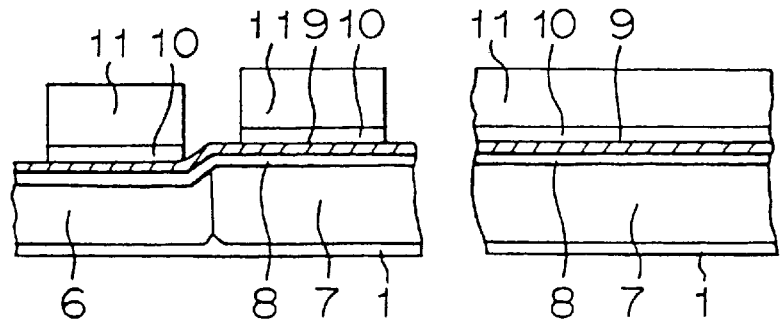
Figure 2:
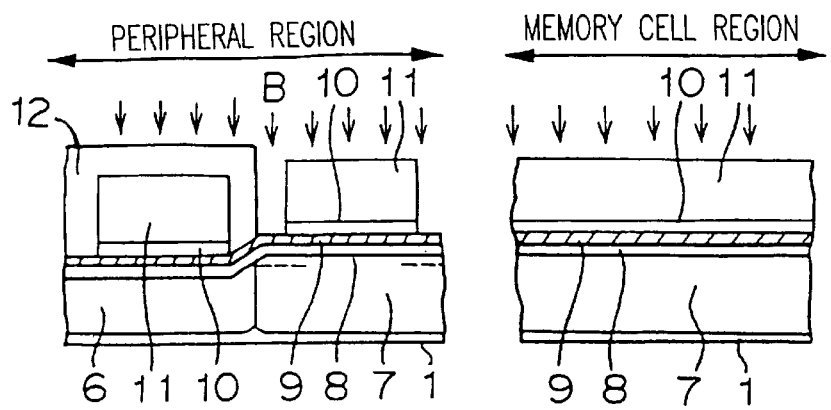
Figure 2:
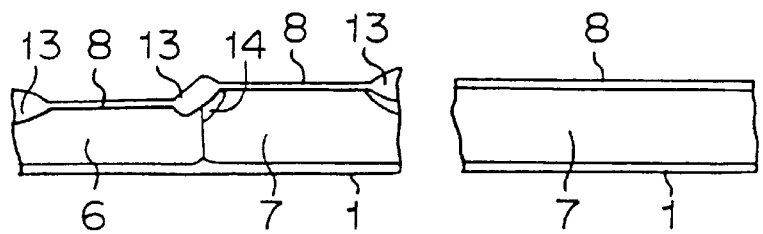
Figure 2:
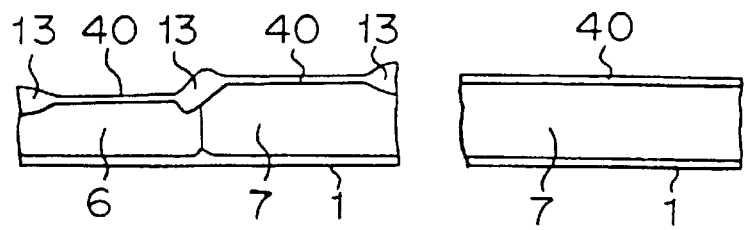
Figure 2:
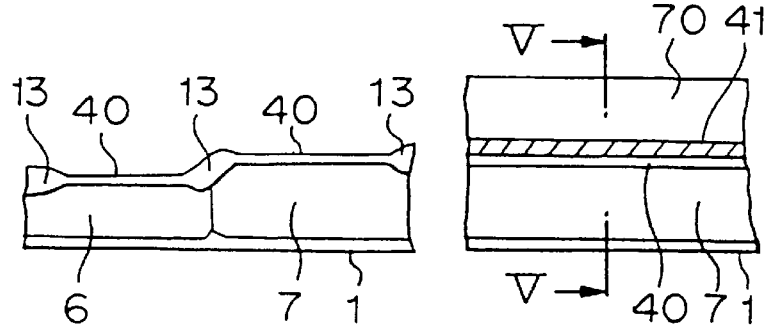
Figure 3:
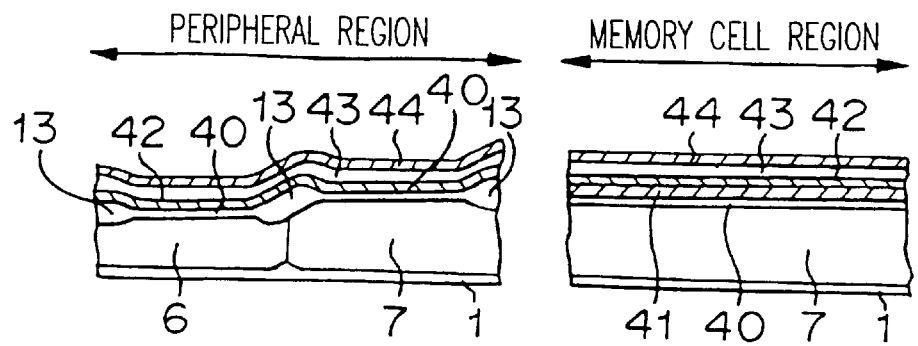
Figure 3:
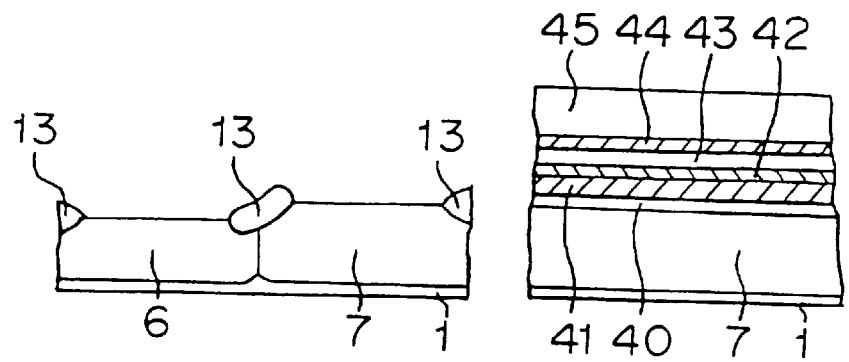
Figure 3:
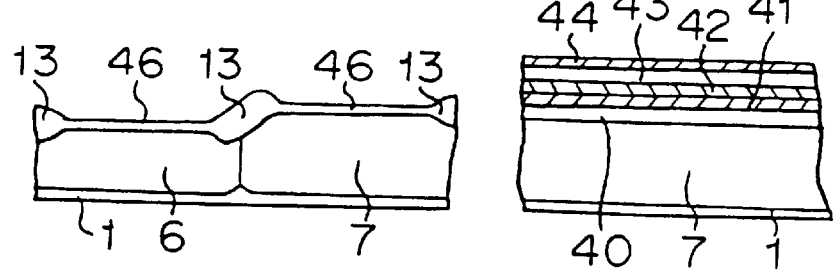
Figure 3:
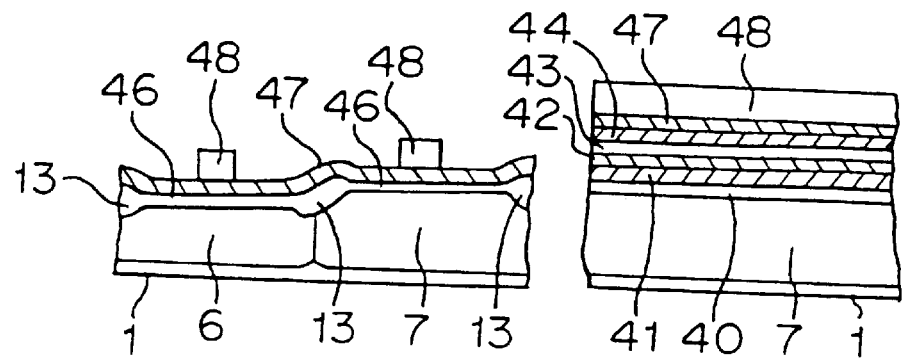
Figure 4:
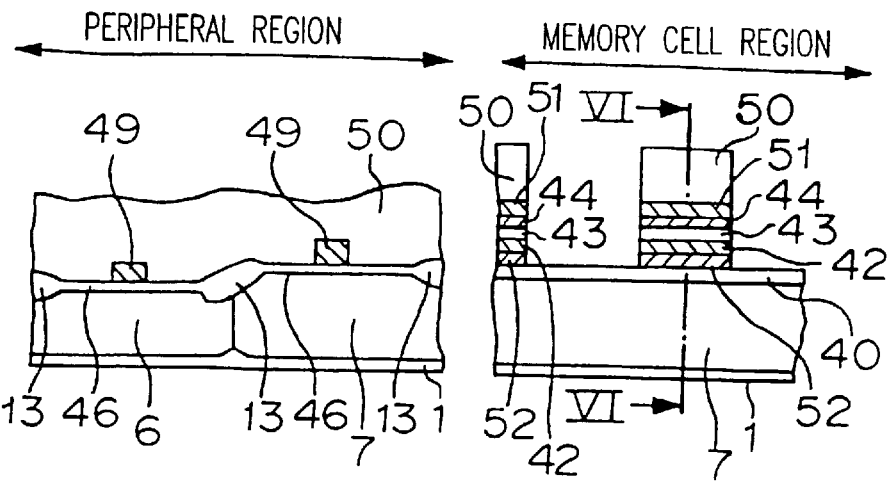
Figure 4:
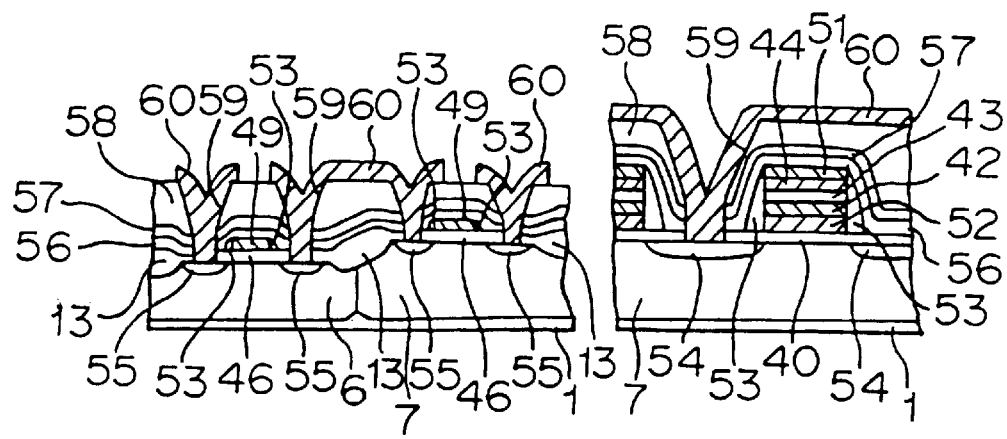
Figure 4:
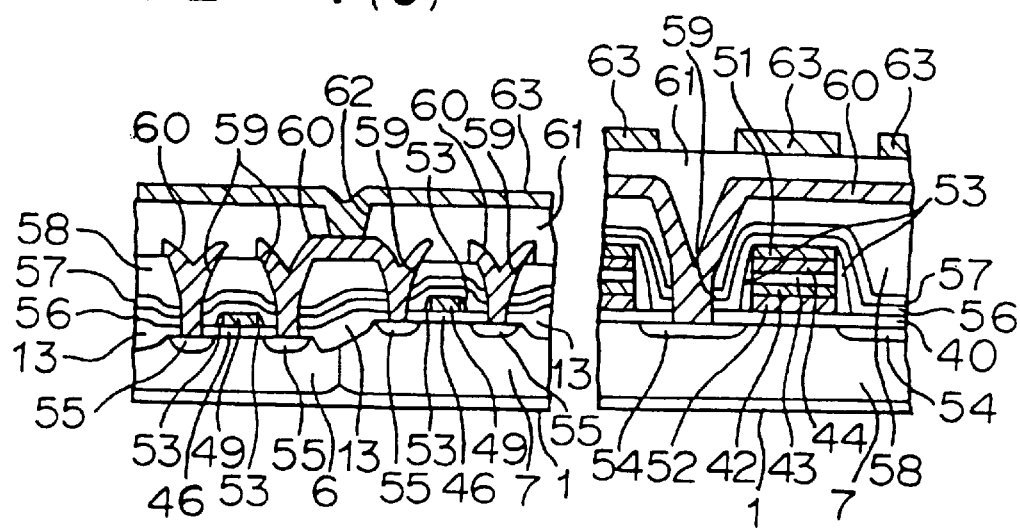
Figure 8:
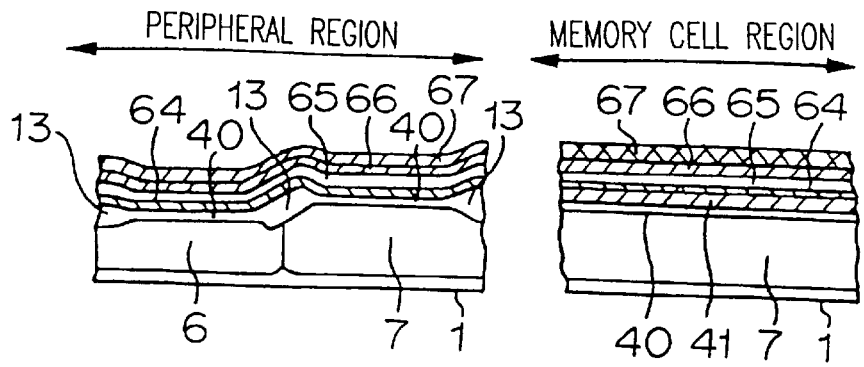
Figure 8:
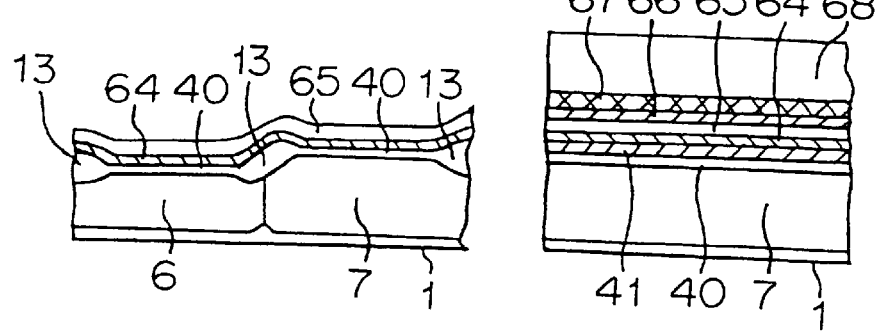
Figure 8:
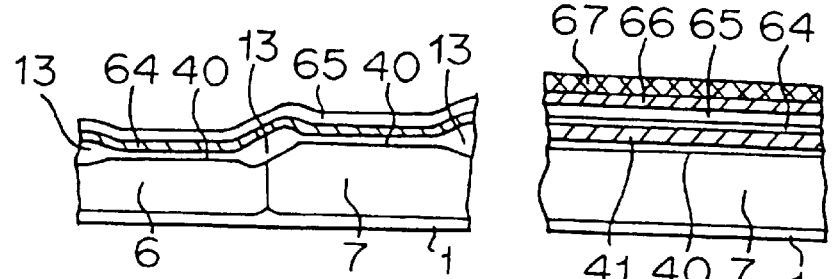
Figure 8:
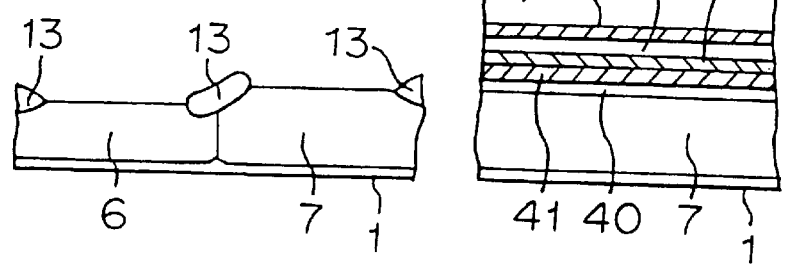
Figure 9:
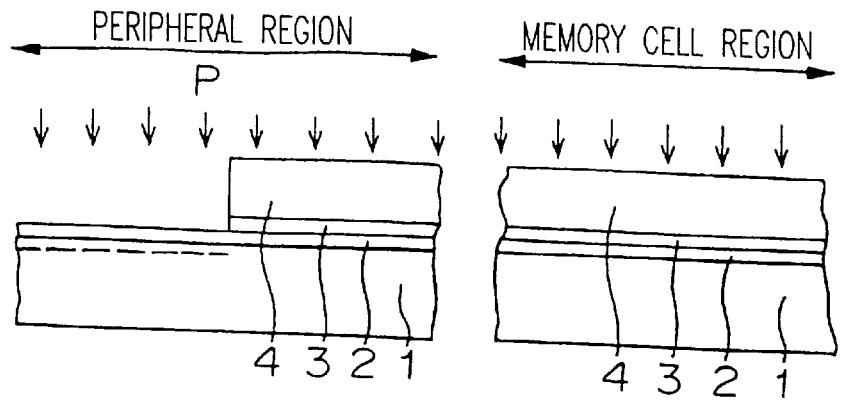
Figure 9:
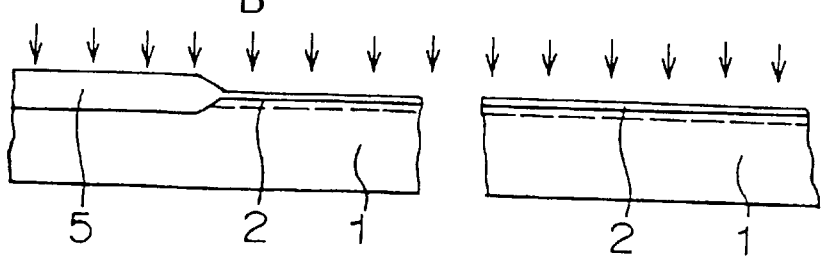
Figure 9:
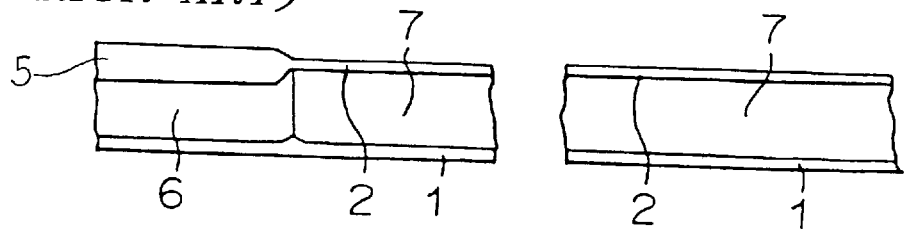
Figure 9:
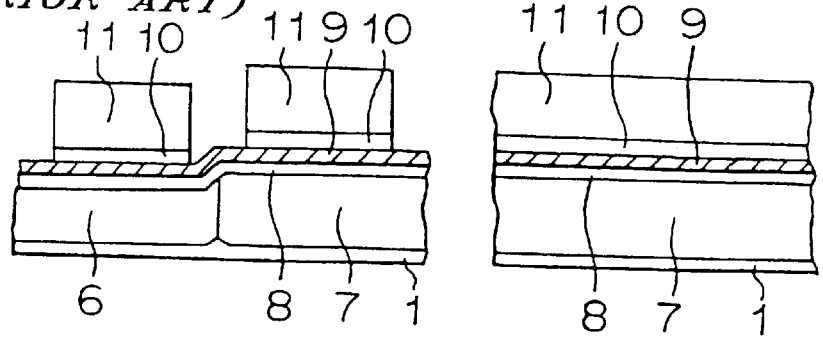

Next, the substrate is immersed in a solution of HF (hydrofluoric acid) at e.g. 25° C. to carry out wet etching, the first resist 68 serving as a mask, to etch the third silicon oxide film 66 (FIG. 8(b)). The first resist 68 is removed (FIG. 8(c)). The first silicon nitride film 65 and the second silicon nitride film 67 which have been thus exposed on the upper surface of the substrate are etched with phosphoric acid. A second resist 69 which is patterned in the same shape as the first resist 68 is formed. Alignment of the first and second resists 68 and 69 need no strict alignment because the alignment is made at a place where the pattern separates the memory cell region from the peripheral region.

Next, the substrate is immersed in a solution of HF (hydrofluoric acid) at e.g. 25° C., the second resist 69 serving as a mask, to etch the second silicon oxide film 64 and the first silicon oxide film 40 (FIG. 8(d)). Then, the subsequent processes described with reference to the first embodiment are carried out to obtain the semiconductor device according to the second embodiment.

In the method according to the second embodiment as explained, the processes for depositing the second silicon nitride film 65 and the second resist 69 are required as additional processes in comparison with the first embodiment. However, in the first embodiment, the etching rate of the silicon nitride film 43 is small as shown in FIG. 7. The time required for treatment is therefore lengthened because the temperature of phosphoric acid is required to be lower than e.g. 150° C. when the removal of the silicon nitride film 43 with phosphoric acid is carried out by the resist serving 45 as a mask as shown in FIG. 3(b). However, in the second embodiment, the treatment temperature for phosphoric acid can be set higher than the heat-resistant temperature of the resist because the first and second silicon nitride films 65 and 67 are removed with phosphoric acid without serving a resist as a mask. As a result, the etching rates of the first silicon nitride film 65 and that of the second silicon nitride film 67 can be increased to make a required processing time shorter than the first embodiment.

In addition, the first embodiment can not use a traditionally used processing vessel for phosphoric acid because the removal of the silicon nitride film 43 with phosphoric acid needs phosphoric acid immersion with the resist 45 left. Use of such a traditionally used processing vessel in the first embodiment involves a possibility of trouble unacceptable in practice because the absence of a phosphoric acid treatment process with the resist left (e.g. the treatment of the silicon nitride film 3 of FIG. 1(b) and that of the silicon nitride film 10 of FIG. 2(c)) in the conventional method requires provision of a new process in production. The first embodiment requires such a new phosphoric acid processing vessel. However, the second embodiment can realize phosphoric acid immersion without a resist. As a result, there is no need for such a new phosphoric acid processing vessel, and such a traditionally used phosphoric acid processing vessel can be used.

In the second embodiment, it is possible to completely remove the first silicon nitride film 65 and the second silicon nitride film 67 without etching the second silicon oxide film 64 and the third silicon oxide film 66 like the first embodiment because etching the first silicon nitride film 65 and the second silicon nitride film 67 is carried out with phosphoric acid.

Although explanation on the respective embodiments has been made in reference to a nonvolatile semiconductor device, the present invention is not limited to such a semiconductor device. The present invention is generally applicable when patterning of a silicon oxide film and a silicon nitride film layered on a semiconductor substrate is required. The present invention is extremely effective to be utilized at a portion where dry-etching of a silicon nitride film involves a small margin because of a reduced film thickness of the silicon oxide film underlying the silicon nitride film as explained with reference to the respective embodiments.

What is claimed is:

1. A method comprising:

sequentially depositing a first silicon oxide film as the silicon oxide film, a first silicon nitride film, a second silicon oxide film and a second silicon nitride film on a semiconductor substrate;

forming a first patterned resist on the second silicon nitride film;

dry-etching the second silicon nitride film, the first resist serving as a mask;

etching the second silicon oxide film with hydrofluoric acid, the first resist serving as a mask;

removing the first resist to expose the first silicon nitride film and the second silicon nitride film on an upper surface of the semiconductor substrate;

etching the first silicon nitride film and the second silicon nitride film with phosphoric acid and without the first resist serving as a mask;

forming a second resist patterned the same and aligned as the first resist on the semiconductor substrate; and etching the first silicon oxide film with hydrofluoric acid, the second resist serving as a mask;

thereby to pattern the first silicon nitride film, the first silicon oxide film and the second silicon oxide film.

2. A method comprising:

depositing a first silicon oxide film on a semiconductor substrate with a memory cell region and a peripheral region;

depositing a first conductive film in the memory cell region;

sequentially depositing a second silicon oxide film, a silicon nitride film and a third silicon oxide film so as to cover the semiconductor substrate and the first conductive film;

forming a resist patterned so as to cover the memory cell region;

etching the third silicon oxide film with hydrofluoric acid, the resist serving as a mask;

etching the silicon nitride film with phosphoric acid, the resist serving as a mask;

etching the second silicon oxide film and the first silicon oxide film with hydrofluoric acid, the resist serving as a mask;

removing the resist;

depositing a gate oxide in the peripheral region on the semiconductor substrate; depositing a second conductive film so as to cover the semiconductor substrate and the third silicon oxide film;

patterning the second conductive film to form gate electrodes in the peripheral region; and patterning the second conductive film, the second silicon oxide film, the silicon nitride film and the third silicon oxide film to form nonvolatile gate electrodes in the memory cell region.

3. The method according to claim 2, comprising:

depositing a first silicon oxide film as the silicon oxide film on a semiconductor substrate with a memory cell region and a peripheral region;

depositing a first conductive film in the memory cell region;

sequentially depositing a second silicon oxide film, a first silicon nitride film as the silicon nitride film, a third silicon oxide film and a second silicon nitride film so as to cover the semiconductor substrate and the first conductive film;

forming a first resist, as the resist, patterned so as to cover the memory cell region;

dry-etching the second silicon nitride film, the first resist serving as a mask;

etching the third silicon oxide film with hydrofluoric acid, the first resist serving as a mask;

removing the first resist to expose the first silicon nitride film and the second silicon nitride film on an upper surface of the semiconductor substrate;

etching the first silicon nitride film and the second silicon nitride film with phosphoric acid and without the first resist serving as a mask;

forming a second resist patterned the same and aligned as the first resist on the semiconductor substrate;

etching the second silicon oxide film and the first silicon oxide film with hydrofluoric acid, the second resist serving as a mask;

removing the second resist;

depositing a gate oxide in the peripheral region on the semiconductor substrate;

depositing a second conductive film so as to cover the semiconductor substrate and the third silicon oxide film;

patterning the second conductive film to form gate electrodes in the peripheral region; and patterning the second conductive film, the second silicon oxide film, the first silicon nitride film and the third silicon oxide film to form nonvolatile gate electrodes in the memory cell region.

4. A method according to claim 1, further comprising setting a treatment temperature for the phosphoric acid in a range of 100° C. to the boiling point of the phosphoric acid.

5. A method according to claim 2, further comprising setting a treatment temperature for the phosphoric acid in a range of 100° C. to the boiling point of the phosphoric acid.

6. A method according to claim 3, further comprising setting a treatment temperature for the phosphoric acid in a range of 100° C. to the boiling point of the phosphoric acid.

* * * * *